United States Patent
Chen et al.

(10) Patent No.: US 7,772,893 B2
(45) Date of Patent: Aug. 10, 2010

(54) DIGITAL FREQUENCY SYNTHESIZER AND METHOD THEREOF

(75) Inventors: Hsiang-Chih Chen, Taipei (TW); Don-Chen Hsin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 85 days.

(21) Appl. No.: 12/164,118

(22) Filed: Jun. 30, 2008

(65) Prior Publication Data
US 2009/0015296 A1 Jan. 15, 2009

(30) Foreign Application Priority Data
Jul. 13, 2007 (TW) ............... 96125626 A

(51) Int. Cl.
*H03B 21/00* (2006.01)
(52) U.S. Cl. ..................... 327/105; 327/107
(58) Field of Classification Search .......... 327/105–107
See application file for complete search history.

(56) References Cited

U.S. PATENT DOCUMENTS

| | | | |
|---|---|---|---|
| 4,933,890 A * | 6/1990 | Nuytkens et al. ............ 708/276 |
| 5,448,191 A * | 9/1995 | Meyer ........................ 327/105 |
| 6,329,850 B1 * | 12/2001 | Mair et al. .................. 327/107 |
| 6,353,649 B1 * | 3/2002 | Bockleman et al. ......... 375/376 |
| 6,420,989 B1 * | 7/2002 | Herbold ...................... 341/155 |
| 6,642,754 B1 * | 11/2003 | Dobramysl et al. ......... 327/105 |
| 6,891,420 B2 * | 5/2005 | Martin et al. ............... 327/260 |
| 7,103,622 B1 * | 9/2006 | Tucholski ................... 708/276 |
| 7,164,297 B2 * | 1/2007 | Flynn ........................ 327/107 |
| 7,205,798 B1 * | 4/2007 | Agarwal et al. ............. 327/105 |
| 7,259,634 B2 * | 8/2007 | Rosenbaum et al. .......... 331/57 |
| 2007/0276891 A1 * | 11/2007 | Warner et al. ............... 708/277 |

* cited by examiner

*Primary Examiner*—Lincoln Donovan
*Assistant Examiner*—Thomas J Hiltunen
(74) *Attorney, Agent, or Firm*—Jianq Chyun IP Office

(57) ABSTRACT

A digital frequency synthesizer and a method thereof are provided. In the digital frequency synthesizer, a plurality of multiphase signals (MPSs) is generated by a phase delay locked loop array, and a transition reference values is generated by a programmable transition value generator. An operation result obtained according to an input signal and an accumulated value is compared with the transition reference values to generate a phase selection control signal. A phase signal is selected among the MPSs according to the phase selection control signal. After that, a sampling control is performed to the selected phase signal to generate a synthetic signal. The digital frequency synthesizer and the method thereof are flexible and are easy to produce tiny analytic phase, thus, not only fine tuning phases is added but also the resolution of the synthetic signal is improved.

18 Claims, 5 Drawing Sheets

DIGITAL FREQUENCY SYNTHESIZER AND METHOD THEREOF

CROSS-REFERENCE TO RELATED APPLICATION

This application claims the priority benefit of Taiwan application serial no. 96125626, filed on Jul. 13, 2007. The entirety of the above-mentioned patent application is hereby incorporated by reference herein and made a part of this specification.

BACKGROUND OF THE INVENTION

1. Field of the Invention

The present invention generally relates to a digital frequency synthesis technique, in particular, to a digital frequency synthesis technique for increasing fine resolution.

2. Description of Related Art

Digital frequency synthesis technique has been advancing quickly along with the increasing requirement to the quality of digital products. Accordingly, various frequency synthesis techniques have been developed regarding digital frequency resolution. For example, FIG. 1(a) is a block diagram of a conventional frequency synthesizer 10. The conventional frequency synthesizer 10 includes an accumulator 12, a read-only memory (ROM) 14, a digital-to-analog converter (DAC) 16, and a low pass filter 18. The method for the frequency synthesizer 10 to generate a synthetic signal OUT1 will be described herein. The accumulator 12 receives an accumulated value K and a clock signal CLK having a system frequency and outputs a phase angle information which varies along time to the ROM 14. The ROM 14 then generates a sine wave signal corresponding to the phase angle information according to a cosine table stored therein and outputs the sine wave signal to the DAC 16. The DAC 16 converts the sine wave signal into an analog signal and outputs the analog signal to the low pass filter 18. The low pass filter 18 filters out the part of the analog signal which does not belong to the system frequency to obtain the synthetic signal OUT1 having a synthesis frequency f0. Taking an N-bit accumulator as an example, if every time the accumulated value K is accumulated and the clock signal CLK having the system frequency is used, the output frequency $f_0 = CLK \times K/(2^N)$.

FIG. 1(b) is a block diagram of another conventional digital frequency synthesizer 20. The digital frequency synthesizer 20 includes an accumulator 22, a phase selection circuit 24, and a multiple phase generator 26. The accumulator 22 outputs a signal 23 having multiple bits, wherein the bits of the signal 23 are divided into most significant bits (MSBs) and least significant bits (LSBs). The phase selection circuit 24 receives the signal 23 and decodes the LSBs of the signal 23 (i.e. the remainder) by using the positive arrival time of the MSBs of the signal 23. In addition, the phase selection circuit 24 selects a phase signal among a plurality of phase signals output by the multiple phase generator 26 according to the decoding result. The MSB positive time is tuned at the positive arrival time of the MSBs of the signal 23 and the tuned signal FOUT2 is output as a synthetic signal.

It should be noted that the frequency synthesis method illustrated in FIG. 1(a) is more complicated than the method illustrated in FIG. 1(b), and fine resolution phase control is more difficult in the method in FIG. 1(a) than that in the method in FIG. 1(b). Even though the cost of the ROM 14 is eliminated in the frequency synthesis method illustrated in FIG. 1(b), the resolution of the synthetic signal cannot be improved easily. Thereby, if the fine phase resolution can be increased in a simple and flexible way, the quality of a digital frequency synthetic signal can be greatly improved.

SUMMARY OF THE INVENTION

Accordingly, the present invention is directed to a digital frequency synthesizer, in which a programmable transition value generator and a phase delay locked loop array are used for generating a plurality of multiple phase signals (MPSs) which have high phase resolution and can be selected correspondingly, and the digital frequency synthesizer provides a flexible fine resolution so that the resolution of a synthetic signal can be improved.

The present invention is directed to a digital frequency synthesis method suitable for a digital frequency synthesizer, in which signal selection and control are performed in fine resolution so that the resolution of a synthetic signal can be improved.

The present invention provides a digital frequency synthesizer for outputting a synthetic signal. The digital frequency synthesizer includes an accumulator, a programmable transition value generator, a phase selection control generator, a phase delay locked loop array, and a phase selection circuit. The accumulator receives an input signal through a control terminal thereof and an accumulated value through a first input terminal thereof and outputs a phase information of the synthetic signal through an output terminal thereof, and the accumulator receives the phase information through a second input terminal thereof, in which the phase information contains a most significant bit (MSB) and a remainder consisting of other bits. The programmable transition value generator generates a plurality of transition reference values. The phase selection control generator is coupled to the accumulator and the programmable transition value generator and receives the phase information and the transition reference values. The phase selection control generator outputs a reference pulse signal according to the MSB and outputs a phase selection control signal according to the remainder and the transition reference values. The phase delay locked loop array includes a resolved phase delay locked loop and at least one phase delay locked loop. The phase delay locked loop array receives the input signal and generates a plurality of phase signals according to the input signal. The resolved phase delay locked loop receives the input signal and generates a resolution-oriented MPS. The phase delay locked loop receives the input signal or a resolution phase input signal in the resolution-oriented MPS. The phase selection circuit is coupled to the phase selection control generator and the phase delay locked loop array and receives the reference pulse signal, the phase selection control signal, and the MPSs, and the phase selection circuit outputs the synthetic signal according to the reference pulse signal, the phase selection control signal, and the MPSs.

The present invention provides a digital frequency synthesis method including following steps. First, an input signal, an accumulated value, and a recursive input signal are received and a phase information is generated according to the input signal, the accumulated value, and the recursive input signal, in which the phase information is the recursive input signal, and the phase information contains a MSB and a remainder. Then, a plurality of transition reference values and a plurality of MPSs are generated. After that, a reference pulse signal is generated according to the MSB. Next, a phase selection control signal is generated according to the remainder and the transition reference values. After that, a phase signal is selected from the MPSs according to the phase selection control signal and the MPS. Finally, a sampling control is performed according to the reference pulse signal and the phase signal to output a synthetic signal.

In the present invention, a fine phase resolution is generated and one of a plurality of MPSs can be selected correspondingly. Moreover, the corresponding transition reference values can be dynamically adjusted according to the output of an accumulator. Thereby, the resolution of a synthetic signal is improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
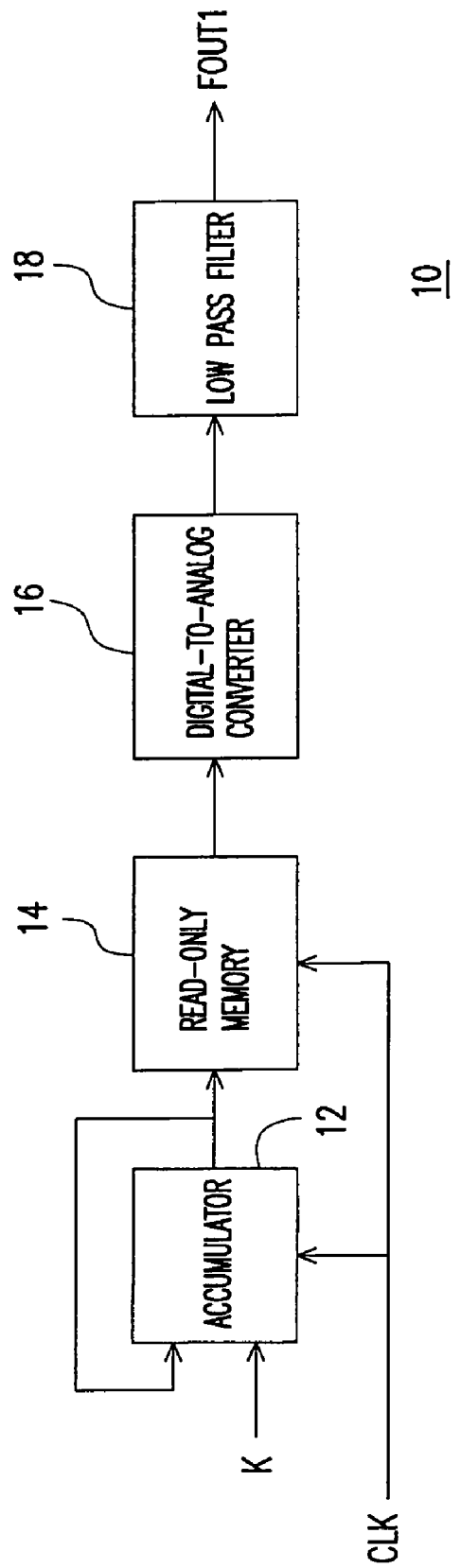
FIG. 1(a) is a block diagram of a conventional frequency synthesizer.

Reference will now be made in detail to the present preferred embodiments of the invention, examples of which are illustrated in the accompanying drawings. Wherever possible, the same reference numbers are used in the drawings and the description to refer to the same or like parts.

Figure 2:
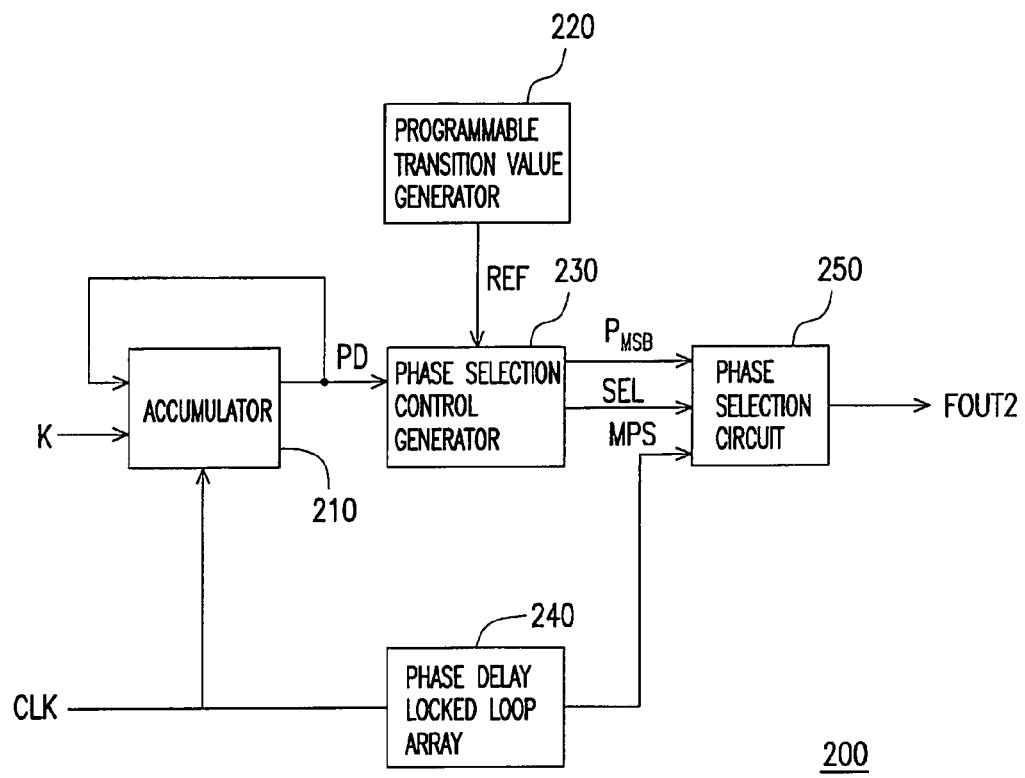
FIG. 2 is a block diagram of a digital frequency synthesizer according to an embodiment of the present invention.

FIG. 2 is a block diagram of a digital frequency synthesizer 200 according to an embodiment of the present invention. Referring to FIG. 2, the digital frequency synthesizer 200 includes an accumulator 210, a programmable transition value generator 220, a phase selection control generator 230, a phase delay locked loop array 240, and a phase selection circuit 250. The digital frequency synthesizer 200 receives an input signal CLK and an accumulated value K, and the digital frequency synthesizer 200 generates and outputs a synthetic signal FOUT2. Below, the operation of the digital frequency synthesizer 200 will be described in detail.

Figure 1B:
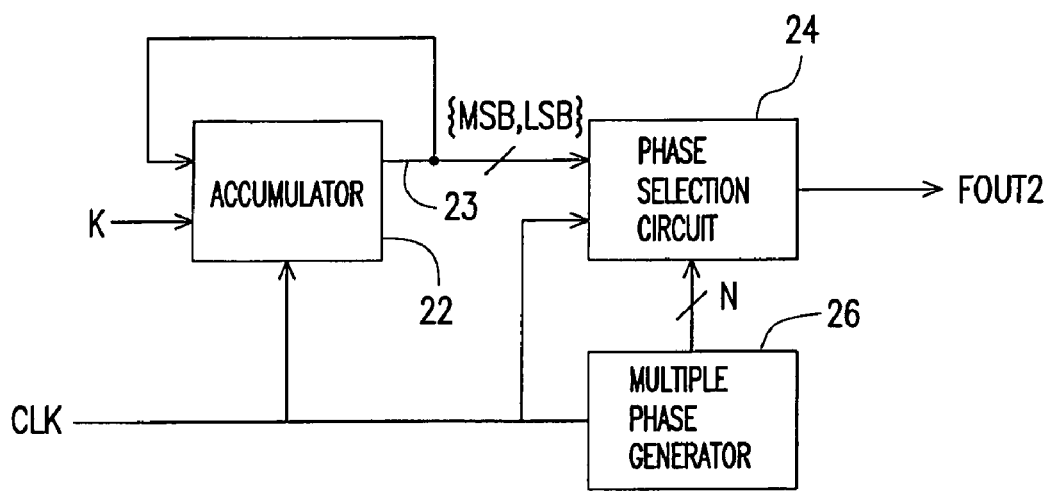
FIG. 1(b) is a block diagram of a conventional digital frequency synthesizer.

In the conventional digital frequency synthesizer illustrated in FIG. 1(b), the phase adjustment of the most significant bit (MSB) positive signal can be considered as comparing the least significant bit (remainder) with a plurality of reference values. Assuming the phase delay locked loop array has 12 phases, if the LSB (remainder) is closer to a particular reference value (12 values in total), the phase corresponding to this value is then selected for re-sampling the MSB positive signal, so as to accomplish the frequency synthesis. According to the method described above, the proportion of the remainder to the accumulated value is related to the proportion of the system cycle to the adjustment time so as to accomplish the purpose of phase adjustment.

The components of the digital frequency synthesizer will be summarized herein. The output of the accumulator represents the change of the phase angle of the frequency to be synthesized along time. The programmable transition value generator generates a plurality of reference values corresponding to the frequency to be synthesized and outputs these reference values to the phase selection control generator. The phase selection control generator receives the {MSB, LSB} resolved by the accumulator and the reference values and generates a MSB positive reference pulse signal $P_{MSB}$ and a phase selection control signal SEL. The phase selection circuit selects a phase signal according to the phase selection control signal SEL and performs a sampling control to the corresponding phase of the MSB, and a frequency synthetic signal FOUT2 can be obtained by re-sampling and adjusting transition time.

Below, the synthesis method provided by the present invention will be described in detail with reference to FIG. 2. In FIG. 2, the accumulator 210 receives the input signal CLK through a control terminal thereof and the accumulated value K through an input terminal thereof and outputs a phase information PD through an output terminal thereof and the accumulator 210 receives the phase information PD as a feedback through another input terminal thereof. The phase information PD is a signal having multiple bits and contains information required for generating the synthetic signal FOUT2. The phase information PD has a MSB and a LSB, in which the LSB is a remainder.

The programmable transition value generator 220 generates a plurality of transition reference values REF and outputs the transition reference values REF to the phase selection control generator 230. The phase selection control generator 230 is coupled to the accumulator 210 and the programmable transition value generator 220 and receives the phase information PD and the transition reference values REF. The phase selection control generator 230 outputs a reference pulse signal $P_{MSB}$ according to the MSB of the phase information PD and compares the LSB (i.e. the remainder) of the phase information PD with the transition reference values REF. The phase selection control generator 230 generates a phase selection control signal SEL according to one of the transition reference values REF which is closest to the remainder.

As described above, the phase delay locked loop array 240 receives the input signal CLK and generates a plurality of multiphase signals (MPSs). The multiple phase signals MPS can be used along with the transition reference values REF, thus, the number of the transition reference values REF is in equal proportion to the number of the multiple phase signals MPS, which may be a one-to-one pattern in an embodiment of the present invention or may also be changed to other patterns by those having ordinary knowledge in the art according to the actual requirement.

The phase selection circuit 250 is coupled to the phase selection control generator 230 and the phase delay locked loop array 240 and receives the reference pulse signal $P_{MSB}$, the phase selection control signal SEL, and the multiple phase signals MPS. Then, the phase selection circuit 250 selects a phase signal among the multiple phase signals MPS according to the phase selection control signal SEL and performs a sampling control to the reference pulse signal $P_{MSB}$ according to the selected phase signal so as to output the synthetic signal FOUT2. Accordingly, in the present embodiment, every time the digital frequency synthesizer 200 outputs a varying synthetic signal FOUT2 according to the accumulated value K and the corresponding transition reference values REF.

Figure 3:
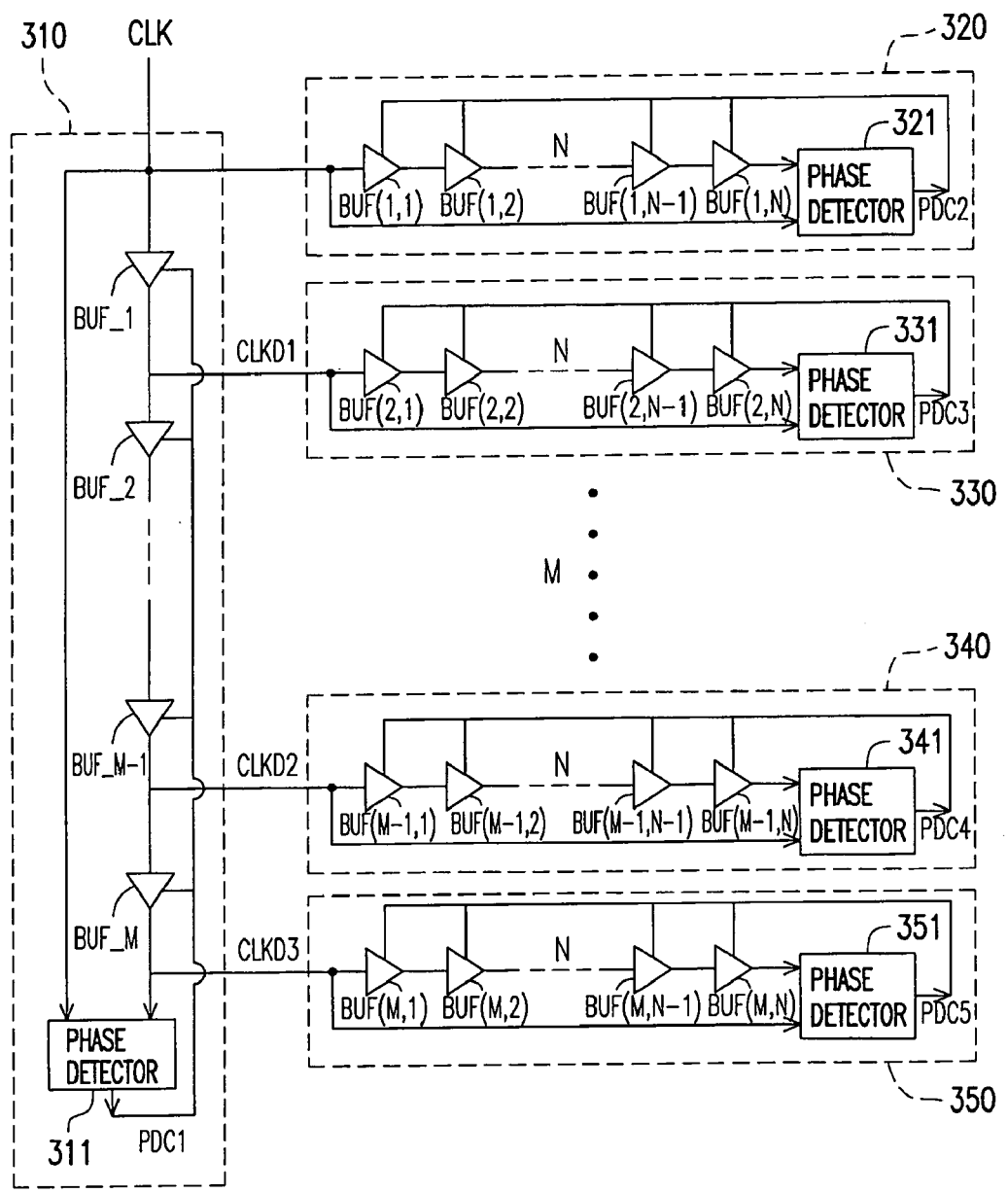
FIG. 3 is a block diagram of a phase delay locked loop array according to an embodiment of the present invention.

Referring to both FIG. 2 and FIG. 3, the circuit structure of the phase delay locked loop array 240 will be further described in detail. FIG. 3 is a block diagram of a phase delay locked loop array 240 according to an embodiment of the present invention. In the present embodiment, the phase delay locked loop array 240 includes a plurality of phase delay locked loops 320, 330, 340, and 350 as illustrated in FIG. 3, and the phase delay locked loop array 240 further includes a resolved phase delay locked loop 310. The resolved phase delay locked loop 310 includes a plurality of buffers BUF_1, BUF_2, . . . , BUF_M−1, and BUF_M as illustrated in FIG. 3 and a phase detector 311, in which the buffers BUF_1, BUF_2, ..., BUF_M–1, and BUF_M are connected to each other in series. The phase detector 311 receives an output signal of the last buffer BUF_M through an input terminal thereof and the input signal CLK through another input terminal thereof. The phase detector 311 compares the two signals received through the two input terminals thereof and generates a resolved phase detection control signal PDC1 for adjusting the delay times of the buffers BUF_1. BUF_2, ..., BUF_M–1, and BUF_M etc. Accordingly, the resolved phase delay locked loop 310 can generate a plurality of resolution-oriented MPSs including the resolution-oriented phase input signals CLKD1, CLKD2, and CLKD3 generated by the buffers BUF_1, BUF_M–1, and BUF_M etc.

The phase delay locked loop 320 illustrated in FIG. 3 will be described as an example. The phase delay locked loop 320 includes a plurality buffers BUF(1,1), BUF(1,2), ..., BUF(1,N–1), and BUF(1,N) and a phase detector 321, in which the buffers BUF(1,1), BUF(1,2), ..., BUF(1,N–1), and BUF(1,N) are connected to each other in series. The phase detector 321 receives an output signal of the last buffer BUF(1,N) through an input terminal thereof and the input signal CLK through another input terminal thereof. The phase detector 321 compares these two signals and generates a phase detection control signal PDC2, for adjusting the delay times of the buffers BUF(1,1), BUF(1,2), ..., BUF(1,N–1), and BUF(1,N). The buffers BUF(1,1), BUF(1,2), ..., BUF(1,N–1), and BUF(1,N) output N different phase signals through their output terminals, and the N phase signals form a plurality of MPSs. The phases of the two signals received by the phase detector 321 through the input terminals thereof can be aligned through the delay control mechanism of the phase detection control signal PDC2.

Additionally, the other phase delay locked loops 330, 340, and 350 respectively receive the resolution-oriented phase input signals CLKD1, CLKD2, and CLKD3. The circuits of the phase delay locked loops 330, 340, and 350 have the same disposition as that of the phase delay locked loop 320 illustrated in FIG. 3 and should be easily deduced according to the present disclosure by those having ordinary skill in the art, therefore will not be described herein.

In another embodiment of the present invention the phase delay locked loop array 240 includes a resolved phase delay locked loop and M phase delay locked loop. In the present embodiment, each phase delay locked loop generates N different phase signals, and then the phase delay locked loop array 240 forms an M×N array circuit. Thus, when the phase delay locked loop array 240 receives an input signal CLK having fixed frequency, the signal cycle of the input signal CLK is divided into M×N different phase signals so as to increase phase signals of different phases and increase the phase resolution of the signal. Each buffer in the M phase delay locked loops outputs a phase signal, and accordingly, a plurality of multiple phase signals MPS are generated and output, in which the multiple phase signals MPS are M*N phase signals.

As described above, the present invention can be implemented by those having ordinary knowledge in the art according to the actual requirement. For example, in another embodiment of the present invention, the phase resolution of the phase delay locked loop array 240 may be adjusted according to the design requirement. For example, the numbers of buffers in the resolved phase delay locked loop 310 and various phase delay locked loops can be increased. The number of the transition reference values REF generated by the programmable transition value generator 220 is also adjusted accordingly. Accordingly, no additional hardware unit is to be used and the phase resolution can be easily increased by expanding an existing digital frequency synthesizer in order to output a synthetic signal FOUT2 of higher resolution.

Figure 4:
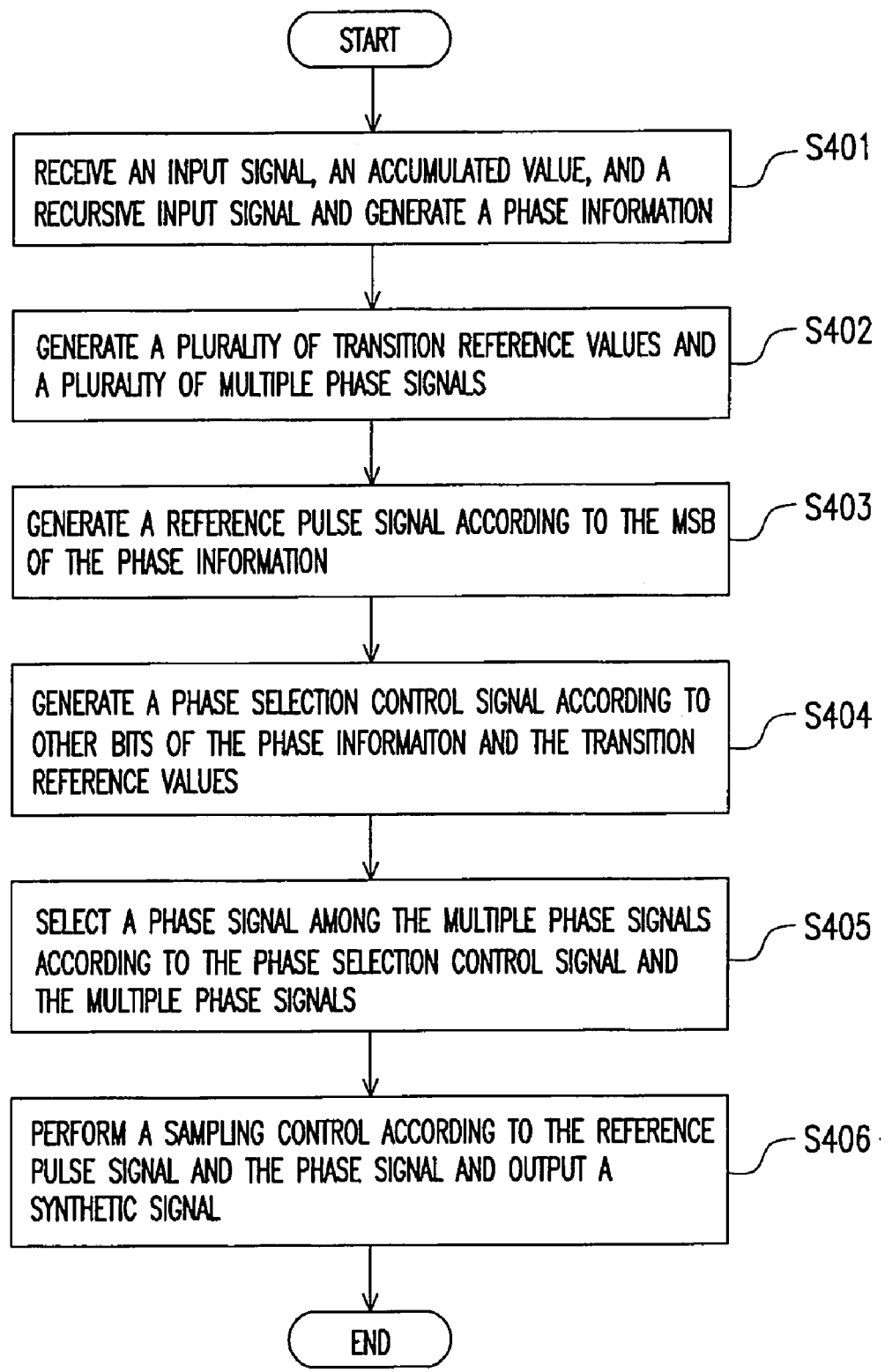
FIG. 4 is a flowchart of a digital frequency synthesis method according to an embodiment of the present invention.

Moreover, a digital frequency synthesis method suitable for the digital frequency synthesizer is also provided by the present invention. FIG. 4 is a flowchart of a digital frequency synthesis method according to an embodiment of the present invention. Referring to FIG. 4, the digital frequency synthesis method includes following steps. First, in step S401, an input signal, an accumulated value, and a recursive input signal are received, and a phase information is generated according to the input signal, the accumulated value, and the recursive input signal. The phase information is also a feedback signal of the recursive input signal, and the phase information contains the information of a plurality of bits, such as a MSB and a remainder consisting of other bits. Next, in step S402, a plurality of transition reference values and a plurality of MPSs are generated, in which the number of the transition reference values is in equal proportion to the number of the MPSs. After that, in step S403, a reference pulse signal is generated according to the MSB. Thereafter, in step S404, the remainder is compared with the transition reference values, and a phase selection control signal is generated according to one of the transition reference values which is closest to the remainder. Next, in step S405, a phase signal is selected among the MPSs according to the phase selection control signal and the MPSs. Finally, in step S406, a sampling control is performed according to the reference pulse signal and the phase signal and a synthetic signal is then output.

In overview, the digital frequency synthesizer and the method thereof provided by the present invention have at least following advantages. In the digital frequency synthesis method, a corresponding phase signal is selected by comparing the phase information and the transition reference values, thus, the read-only memory in the conventional technique can be skipped. Besides, the phase delay locked loop array is implemented as a 2-dimensional array circuit to generate higher phase resolution, thus, the frequency synthesizer and the method thereof are more flexible and can generate higher phase resolution compared to the conventional technique. Thereby, both the fine tuning phase and the resolution of the synthetic signal are increased in the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital frequency synthesizer, comprising:
an accumulator, for receiving an input signal and an accumulated value and outputting a phase information accordingly, the phase information being sent back to the accumulator, wherein the phase information comprises a most significant bit (MSB) and a remainder;
a transition value generator, for generating a set of a plurality of transition reference values;
a phase selection control generator, coupled to the accumulator and the transition value generator, for receiving the phase information and the set of the transition reference values, the phase selection control generator outputting a reference pulse signal according to the MSB and comparing the remainder and the transition reference values for outputting a phase selection control signal;

a phase delay locked loop array, for receiving the input signal and generating a set of a plurality of multiphase signals (MPSs); and a phase selection circuit, coupled to the phase selection control generator and the phase delay locked loop array, the phase selection circuit for receiving the reference pulse signal, the phase selection control signal, and the set of the MPSs and outputting a frequency synthetic signal accordingly.

2. A digital frequency synthesizer, comprising:

an accumulator, for receiving an input signal and an accumulated value and outputting a phase information accordingly, the phase information being sent back to the accumulator, wherein the phase information comprises a most significant bit (MSB) and a remainder;

a transition value generator, for generating a set of a plurality of transition reference values;

a phase selection control generator, coupled to the accumulator and the transition value generator, for receiving the phase information and the set of the transition reference values, the phase selection control generator outputting a reference pulse signal according to the MSB and outputting a phase selection control signal according to the remainder and the set of the transition reference values;

a phase delay locked loop array, for receiving the input signal and generating a set of a plurality of multiphase signals (MPSs), wherein the phase delay locked loop array comprises a resolved phase delay locked loop and at least one phase delay locked loop, and the phase delay locked loop array is adapted for receiving the input signal and generates the MPSs, wherein the resolved phase delay locked loop receives the input signal and generates a plurality of resolution-oriented phase signals, and the phase delay locked loop receives the input signal and one of the resolution-oriented phase signals and outputs the resolved MPSs; and a phase selection circuit, coupled to the phase selection control generator and the phase delay locked loop array, the phase selection circuit for receiving the reference pulse signal, the phase selection control signal, and the set of the MPSs and outputting a frequency synthetic signal accordingly.

3. The digital frequency synthesizer according to claim 1, wherein the phase selection control generator generates the corresponding phase selection control signal according to one of the transition reference values which is closest to the remainder.

4. The digital frequency synthesizer according to claim 1, wherein the number of the set of the MPSs is in equal proportion to the number of the transition reference values.

5. The digital frequency synthesizer according to claim 1, wherein the phase selection circuit selects a phase signal among the MPSs according to the phase selection control signal and performs a sampling control to the reference pulse signal according to the phase signal to output the frequency synthetic signal.

6. The digital frequency synthesizer according to claim 1, wherein the resolved phase delay locked loop comprises a plurality of first buffers and a first phase detector, wherein the first buffers are connected in series, the first phase detector receives and compares an output signal of the last one of the first buffers and the input signal and generates a resolved phase detection control signal according to the comparison result for adjusting the delay times of the first buffers.

7. The digital frequency synthesizer according to claim 6, wherein each phase delay locked loop comprises a plurality of second buffers and a second phase detector, wherein the second buffers are connected in series, the second phase detector receives and compares an output signal of the last second buffer and one of the input signal and the delayed resolved phase input signal and generates a phase detection control signal according to the comparison result for adjusting the delay times of the second buffers.

8. The digital frequency synthesizer according to claim 1, wherein the frequency synthetic signal varies along time.

9. A digital frequency synthesis method, comprising:

receiving an input signal, an accumulated value, and a recursive input signal and generating a phase information depending on the input signal, the accumulated value and the recursive input signal, wherein the phase information is a feedback signal of the recursive input signal, and the phase information comprises a most significant bit (MSB) and a remainder;

generating a reference pulse signal according to the MSB;

generating a phase selection control signal according to the remainder and a set of a plurality of transition reference values;

selecting a phase signal among one of a plurality of multiphase signals (MPSs) according to the phase selection control signal and the MPSs; and performing a sampling control according to the reference pulse signal and the phase signal and outputting a frequency synthetic signal.

10. The digital frequency synthesis method according to claim 9, wherein in the step of comparing the remainder and the transition reference values, the phase selection control signal is generated according to one of the transition reference values which is closest to the remainder.

11. The digital frequency synthesis method according to claim 9, wherein the number of the MPSs is in equal proportion to the number of the transition reference values.

12. The digital frequency synthesis method according to claim 9, wherein the frequency synthetic signal varies along time.

13. The digital frequency synthesis method according to claim 9, wherein the MPSs are generated by a phase delay locked loop array, the phase delay locked loop array comprises a resolved phase delay locked loop and at least one phase delay locked loop, the phase delay locked loop array receives the input signal and generates the MPSs, wherein the resolved phase delay locked loop receives the input signal and generates a plurality of resolution-oriented phase signals, and the phase delay locked loop receives the input signal and one of the resolution-oriented phase signals and outputs the resolved MPSs.

14. A digital frequency synthesizer, comprising:

a phase selection control generator, for receiving a phase information and a set of a plurality of transition reference values and outputting a reference pulse signal according to a MSB of the phase information, and the phase selection control generator outputting a phase selection control signal by comparing a remainder of the phase information and the transition reference values, wherein the phase information is obtained by performing an accumulation on an input signal and an accumulated value;

a phase delay locked loop array, for receiving the input signal and generating a plurality of MPSs; and a phase selection circuit, coupled to the phase selection control generator and the phase delay locked loop array, the phase selection circuit for receiving the reference pulse signal, the phase selection control signal, and the MPSs and outputting a frequency synthetic signal.

15. The digital frequency synthesizer according to claim 14, wherein the phase delay locked loop array comprises a resolved phase delay locked loop and at least one phase delay locked loop, the phase delay locked loop array receives the input signal and generates the MPSs, wherein the resolved phase delay locked loop receives the input signal and generates a plurality of resolution-oriented phase signals, and the phase delay locked loop receives the input signal and one of the resolution-oriented phase signals and outputs the resolved MPSs.

16. The digital frequency synthesizer according to claim 15, wherein the phase selection control generator compares the remainder and the transition reference values and generates the phase selection control signal according to one of the transition reference values which is closest to the remainder.

17. The digital frequency synthesizer according to claim 15, wherein the number of the MPSs is in equal proportion to the number of the transition reference values.

18. The digital frequency synthesizer according to claim 15, wherein the phase selection circuit selects a phase signal among the MPSs according to the phase selection control signal and performs a sampling control to the phase signal according to the reference pulse signal to output the frequency synthetic signal.

* * * * *